United States Patent

Kepler et al.

[11] Patent Number: 5,844,836
[45] Date of Patent: Dec. 1, 1998

[54] MEMORY CELL HAVING INCREASED CAPACITANCE VIA A LOCAL INTERCONNECT TO GATE CAPACITOR AND A METHOD FOR MAKING SUCH A CELL

[75] Inventors: Nicholas John Kepler, San Jose; Asim A. Selcuk, Cupertino; Richard K. Klein; Craig S. Sander, both of Mountain View; John C. Holst, San Jose; Christopher A. Spence; Raymond T. Lee, both of Sunnyvale, all of Calif.; Stephen C. Horne, Austin, Tex.

[73] Assignee: Advanced Micro Devices, Inc., Sunnyvale, Calif.

[21] Appl. No.: 822,518

[22] Filed: Mar. 24, 1997

[51] Int. Cl.⁶ .................................................. G11C 11/00
[52] U.S. Cl. ............................. 365/156; 365/154
[58] Field of Search .................... 365/156, 154, 365/51, 185.28, 230.06

[56] References Cited

U.S. PATENT DOCUMENTS

| | | | |
|---|---|---|---|
| 5,040,036 | 8/1991 | Hazani | 365/185.28 |
| 5,459,686 | 10/1995 | Saito | 365/149 |
| 5,483,083 | 1/1996 | Meguro et al. | 365/154 |
| 5,487,044 | 1/1996 | Kawaguchi et al. | 365/203 |
| 5,489,790 | 2/1996 | Lage | 257/330 |
| 5,699,289 | 12/1997 | Takenaka | 365/51 |
| 5,708,621 | 1/1998 | Tanoi | 365/230.06 |

Primary Examiner—David Nelms
Assistant Examiner—David Lam
Attorney, Agent, or Firm—Foley & Lardner

[57] ABSTRACT

A static random access memory (SRAM) cell having increased cell capacitance at the storage nodes utilizes a capacitive structure. The capacitive structure includes a dielectric material between polysilicon conductive lines and tungsten local interconnects. The polysilicon plates are each connected to drains of lateral transistors associated with the SRAM cell. A dielectric material such as silicon dioxide may be deposited between the local interconnect and polysilicon conductive lines. The capacitor structures are provided between first and second N-channel pull down transistors associated with the SRAM cell.

20 Claims, 5 Drawing Sheets

MEMORY CELL HAVING INCREASED CAPACITANCE VIA A LOCAL INTERCONNECT TO GATE CAPACITOR AND A METHOD FOR MAKING SUCH A CELL

CROSS REFERENCE TO RELATED CASES

The present application is related to U.S. application Ser. No. 08/823,081 entitled, "A Static Random Access Memory Cell Having Buried Sidewall Capacitors Between Storage Nodes And A Method For Making Such A Cell," filed by Selcuk on an even date herewith. The present application is also related to U.S. application Ser. No. 08/823,817 entitled, "A Static Random Access Memory Cell Having A Trench Field Plate For Increased Capacitance And A Method For Making Such A Cell," filed by Lee et al. on an even date herewith.

FIELD OF THE INVENTION

The present invention relates generally to integrated circuit devices having enhanced capacitance. More particularly, the present invention relates to a memory cell having enhanced capacitance by utilizing a local interconnect.

BACKGROUND OF THE INVENTION

Semiconductor memory devices such as random access memory (RAM) devices typically include a number of memory cells coupled to at least one bit line. The memory cells often include at least one storage transistor or device, and at least one pass gate transistor. Generally, two storage transistors are coupled between two pass gate transistors, and a bit line is coupled to each of the pass transistors. Thus, each memory cell is often located between two bit lines.

The pass gate transistors (e.g. transfer gates) have gate electrodes that are coupled to word lines. A signal such as an address or select signal is provided on the word line associated with the memory cell to select or access a particular memory cell. Once the memory cell is selected via the word line, the memory cell can be read or written to through the pass gate transistors via the bit lines.

Semiconductor memory cells include static RAM devices (SRAMs). The memory cell of the SRAM often contains two inverters connected in anti-parallel (e.g., cross-coupled inverters). Basically, each cell is a flip-flop which has two stable states (e.g., a logic 1 or a logic 0). The memory cell is generally made of four or six transistors. In a four transistor SRAM cell, a first resistor is coupled in series with a first pull down (e.g., storage or drive) transistor at a first storage node, and a second resistor is coupled in series with a second pull down transistor at a second storage node. A first pass gate is coupled between a first bit line and the first storage node, and a second pass gate is coupled between a second bit line and a second storage node.

In a six transistor memory cell, the first and second resistors are replaced by first and second load transistors. The load transistors can be P-channel transistors, diodes or depletion mode N-channel transistors or otherload elements. The pull down transistors and pass gate transistors for both four transistor cells and six transistor cells are often N-channel enhancement mode transistors.

As memory cell size has steadily decreased, more memory cells can be located on a single semiconductor substrate. The decreased memory cell size makes it more difficult for the memory cell to sink (e.g., receive) and source (e.g., supply) current as the memory cell is accessed. The current sinking and sourcing problem is enhanced by the larger capacitance and resistance associated with longer bit lines because the transmitted signal across the bit lines is dissipated across the longer length of the bit lines. For example, the memory cell must provide enough current sinking and sourcing capability to overcome the capacitance and resistance of the entire bit line before the logic level of the signal may be appropriately read from the cell or be appropriately written to the cell.

Thus, there is a need for a memory cell which has superior current sourcing and sinking characteristics. Further, there is a need for a memory cell of minimal size which can appropriately read, write, and store logic signals. Further still, there is a need for a stable memory cell of small size which is relatively immune to noise and which does not require a significant number of additional fabrication steps.

SUMMARY OF THE INVENTION

The present invention relates to a memory cell having an enhanced cell capacitance. The memory cell includes a portion of a semiconductor substrate, a first inverter having a first inverter input and a first inverter output, and a second inverter having a second inverter input and a second inverter output. The second inverter input is coupled to the first inverter output by a first conductive line, and the second inverter output is coupled to the first inverter input by a second conductive line. A first local interconnect is provided over the first conductive line and is electrically coupled to the second conductive line. A first dielectric material is provided between the first conductive line and the first local interconnect. The capacitance associated with the first inverter output is enhanced.

The present invention further relates to an SRAM memory cell having enhanced cell capacitance. The SRAM memory cell includes a first transistor and a second transistor forming a storage unit. The first transistor has a first gate and a first drain, and the second transistor has a second gate and a second gate drain. The first gate is coupled to the second drain by a first conductive line. The second gate is coupled to the first drain by a second conductive line. The first conductive line is partially covered by a first dielectric layer and the first dielectric layer is covered by a first local interconnect. The first local interconnect is electrically coupled to the second conductive line. The capacitance associated with the memory cell is enhanced.

The present invention still further relates to a method of manufacturing a memory cell including a first pull down transistor having a first gate and a second pull down transistor having a second gate. The method includes steps of providing a first conductive line from the first gate to the second pull down transistor, providing a second conductive line from the second gate to the first pull down transistor, providing a first dielectric layer over at least a portion of the first connective line, and providing a first local interconnect electrically coupled to the second conductive line and over the first dielectric layer, thereby enhancing capacitance associated with the memory cell.

In one aspect of the present invention, the current sourcing and sinking capabilities of an SRAM memory cell are enhanced by providing a capacitive structure above the conductors associated with the cross coupled inverters of a memory cell. The capacitive structure is preferably located above the conductors (e.g., polysilicon conductive lines associated with the cross coupled inverters in a memory cell). The memory cell includes two capacitors; one coupled to each drain region (e.g., each of the storage nodes of the cell) of the pull down transistors associated with the memory cell. Each capacitor includes a local interconnect coupled to one gate and provided over a dielectric material which is provided over the conductor coupled to the other gate. The capacitive structure enhances the capacitance associated with the memory cell.

In another aspect of the invention, the enhanced capacitance of the memory cell is schematically embodied by two capacitors. The capacitors are located between the two storage nodes. The capacitors allow the memory cell to operate more quickly, and have more noise immunity because more of a disturbance is required to substantially discharge the stored charge of the memory cell.

In yet another aspect of the present invention, each capacitor is formed by providing a tungsten local interconnect over an oxide dielectric material. The oxide material can be a high-temperature oxide or a two-layer stack material with oxide over nitride. The oxide material is preferably provided over a polysilicon conductive line.

According to still another aspect of the present invention, the dielectric material is provided over substantially formed lateral transistors and selectively etched. After etching, the substantially formed transistors are covered by an etch stop layer such as silicon nitride or silicon oxide nitride. After the etch stop layer, an insulating layer is provided over the substantially formed transistors. The insulation layer is selectively etched to expose the gate conductors at particular locations for connection to the local interconnect. The local interconnect is often necessary for other fabrication and circuit operations.

BRIEF DESCRIPTION OF THE DRAWINGS

The invention will hereafter be described with reference to the accompanying drawings wherein like numerals denote like elements, and.

DETAILED DESCRIPTION OF THE PREFERRED EXEMPLARY EMBODIMENT OF THE PRESENT INVENTION

Figure 1:
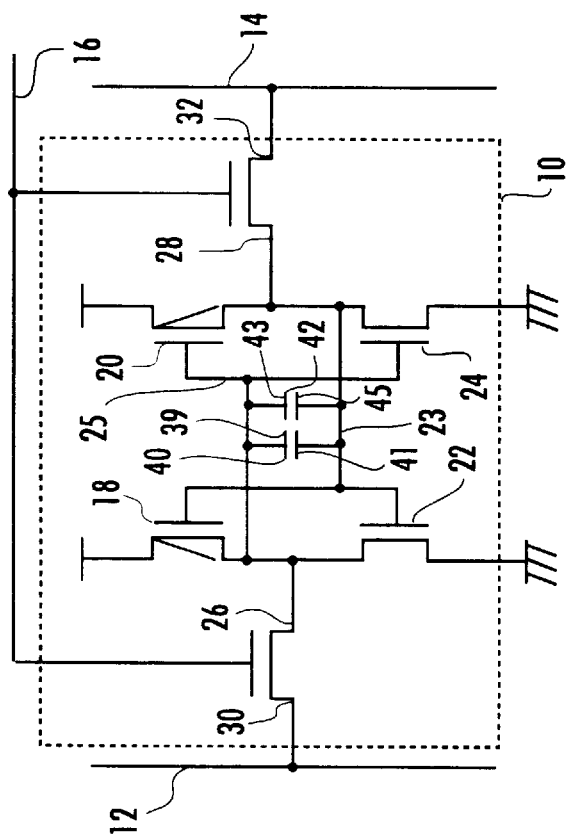
FIG. 1 is an electrical schematic drawing of a memory cell in accordance with an exemplary embodiment of the present invention.

With reference to FIG. 1, a memory cell 10 is coupled between complimentary bit lines 12 and 14 and is coupled to a word line 16. Memory cell 10 is preferably a static random access memory cell (SRAM) including a load transistor 18, a load transistor 20, a drive or pull down transistor 22 and a drive or pull down transistor 24. Transistors 18, 20, 22, and 24 are coupled together to form cross-coupled inverters having a storage node 26 and a storage node 28.

Transistors 18 and 20 are preferably P-channel transistors, but may be replaced by polysilicon or other resistors, N-channel depletion mode transistors, or other electrical devices for raising the voltage at storage nodes 26 and 28 when pull down transistors 22 and 24 are turned OFF, respectively. Pull down transistors 22 and 24 are preferably N-channel transistors, although other types of transistors such as bipolar transistors or other devices may be utilized. Transistors 22 and 24 are preferably conventional N-channel enhancement mode transistors having a gate threshold voltage between 0.5 and 0.6 volts (V).

Storage node 26 is coupled to a pass gate transistor 30 which is controlled by word line 16. Storage node 28 is coupled to a pass gate transistor 32 which is also controlled by word line 16. Pass gate transistors 30 and 32 are preferably N-channel enhancement mode transistors having a gate threshold voltage between 0.5 and 0.60, although other types of transistors may be utilized. Alternatively, lower gate threshold voltage such as below 0.4 volts.

Transistors 18 and 22 form a first inverter having an input at conductive line 23, and transistors 20 and 24 form a second inverter having an input at conductive line 25. Conductive line 23 is coupled to the output of the second inverter formed by transistors 20 and 24 (e.g., storage node 28). Similarly, conductive line 25 is coupled to the output of the first inverter formed by transistors 18 and 22 (e.g., storage node 26). Thus, transistors 18, 20, 22 and 24 form cross coupled inverters having outputs at storage nodes 26 and 28.

In operation, cell 10 stores logic signals, or information such as a logic 1 (e.g., VCC) or logic 0 (e.g., ground) on nodes 26 and 28. When transistor 22 is turned on, transistor 18 is turned off and node 26 is coupled to ground. When transistor 24 is turned off, transistor 20 is turned on and node 28 is coupled to VCC or power. Conversely, when transistor 22 is turned off, transistor 18 is turned on and node 26 is coupled to VCC. When transistor 24 is turned on, transistor 20 is turned off and node 28 is coupled to ground. The logic level stored on node 26 is opposite the logic level stored on node 28.

Cell 10 is accessed for reading from and writing to nodes 26 and 28 when a select signal, such as a logic 1 or VCC, is provided on word line 16. Memory cell 10 is accessed as pass gate transistors 30 and 32 couple bit lines 12 and 14 to nodes 26 and 28, respectively, in response to the select signal on word line 16.

In a read operation, cell 10 is accessed by providing the select signal on line 16. During the read operation, the signal at storage node 26 is provided to bit line 12 while the signal at storage node 28 is provided to bit line 14. The signals on lines 12 and 14 are then read by a sense amplifier (not shown).

In a write operation, cell 10 is accessed by providing the select signal on line 16. During the write operation, the signal on bit line 12 is driven to node 26 while the signal on bit line 14 is driven to node 28. After the select signal on line 16 is removed, cell 10 stores the signals driven on lines 12 and 14. Cell 10 stores the signals on nodes 26 and 28, respectively. The signals on lines 12 and 14 are complimentary to each other.

Storage nodes 26 and 28 must be able to receive and transmit current to receive and transmit the appropriate logic or storage signals across bit lines 12 and 14, respectively. To sink and source more current on bit lines 12 and 14, memory cell 10 advantageously employs a capacitor 40 between storage node 26 and 28 ground, and a capacitor 42 between storage nodes 26 and 28. Capacitor 40 includes a plate 39 and a plate 41, and capacitor 42 includes a plate 45 and a plate 43.

Capacitors 40 and 42 provide superior current sourcing and sinking capability for memory cell 10.

Capacitors 40 and 42 allow transistors 18, 20, 22 and 24 to store more charge on storage nodes 26 and 28. Therefore, despite the small size of cell 10 and the length of lines 12 and 14, nodes 26 and 28 can provide and receive adequate logic signals on lines 12 and 14. Additionally, the enhanced capacitance increases the stability and noise immunity of cell 10.

Figure 2:
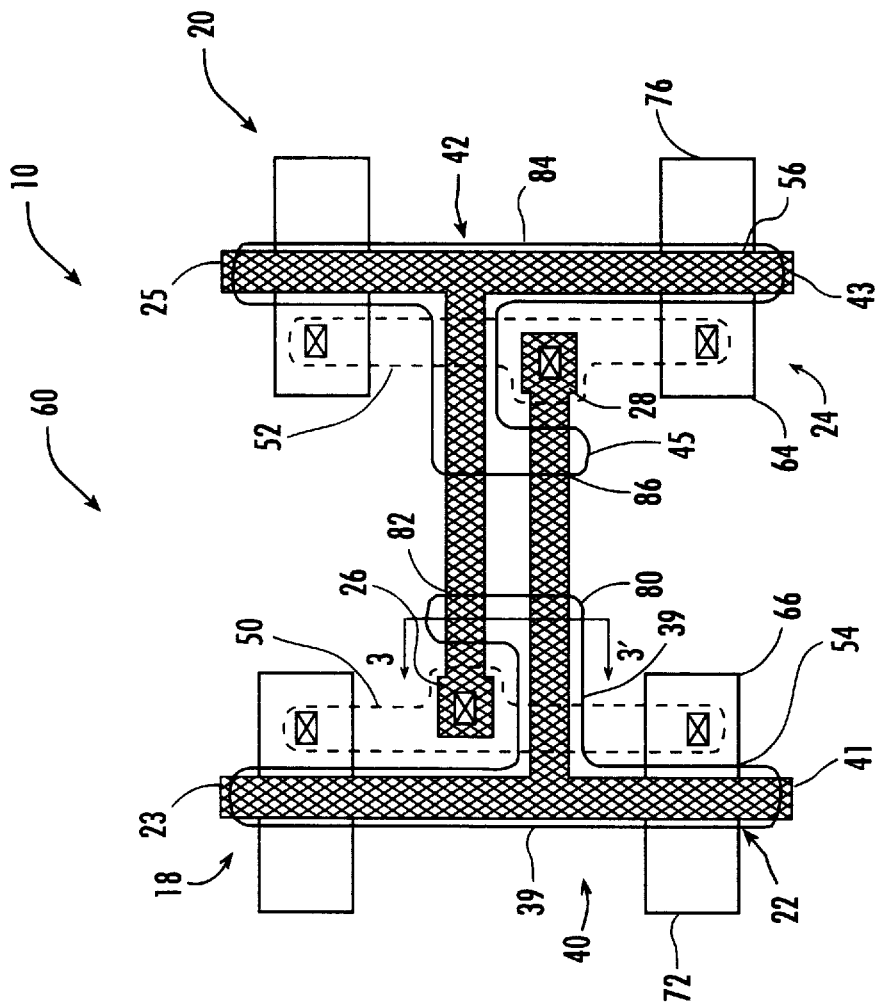
FIG. 2 is a top view schematic layout drawing of a portion of the memory cell illustrated in FIG. 1 in accordance with an exemplary embodiment of the present invention.

With reference to FIG. 2, a top view schematic layout drawing of a 3:3' of cell 10 is shown. Transistors 18, 20, 22 and 24 are preferably lateral transistors. Additionally, transistors 30 and 32 can be lateral transistors. Alternatively, transistors 18, 20, 22, 24, 30, and 32 can be vertical transistors, or thin film transistors. A gate 54 of transistor 22 is coupled to node 28 via polysilicon conductive line 41, and a gate 56 of transistor 24 is coupled to node 26 via polysilicon conductive line 43. Lines 41 and 43 cross couple transistors 18, 20, 22 and 24.

A drain 66 of transistor 22 is coupled to node 26 via a conductive metal line 50 (shown in dashed lines), and a drain 64 of transistor 24 is coupled to node 28 via a conductive metal line 52 (shown in dashed lines). A source 72 of transistor 22 is coupled to ground, and a source 76 of transistor 24 is coupled to ground.

Capacitors 40 and 42 are located over portions of lines 41 and 43, respectively. Capacitor 40 is formed by plate 39 associated with a tungsten local interconnect 80 and plate 41 associated with polysilicon conductive line 23. Tungsten local interconnect 80 is electrically coupled to polysilicon conductive line 25 at area 82. A dielectric material (not shown in FIG. 2) is provided between polysilicon conductive line 23 and local interconnect 80 to form capacitor 40.

Plate 45 of capacitor 42 is associated with a tungsten local interconnect 84 which is formed over a dielectric material or layer (not shown in FIG. 2) that is deposited on top of polysilicon conductive line 25. Line 25 is associated with plate 43 of capacitor 42. Local interconnect 84 is electrically coupled to polysilicon conductive line 23 at area 86.

Local tungsten interconnects 80 and 84 can be any conductive material such as doped polysilicon, amorphous polysilicon, metal, or other substances. Additionally, tungsten local interconnects 80 and 84 can each be coupled to various other items associated with cell 10 or other integrated circuit elements. Preferably, local interconnects 80 and 84 are utilized to provide additional connections for cell 10 and serve the dual purpose of providing plates 39 and 45 as well as making those additional interconnections. Conductive lines 23 and 25 can be a doped polysilicon material or other conductive substances.

The particular geometry, and materials described with reference to FIG. 2 are shown only as an exemplary embodiment of the present invention. The particular geometry of cell 10 can be adjusted various ways to provide particular operating parameters for cell 10. For example, transistors 18, 20, 22 and 24 can be provided at various orientations to form cell 10 without departing from the scope of the invention as recited in the claims.

Figure 3:
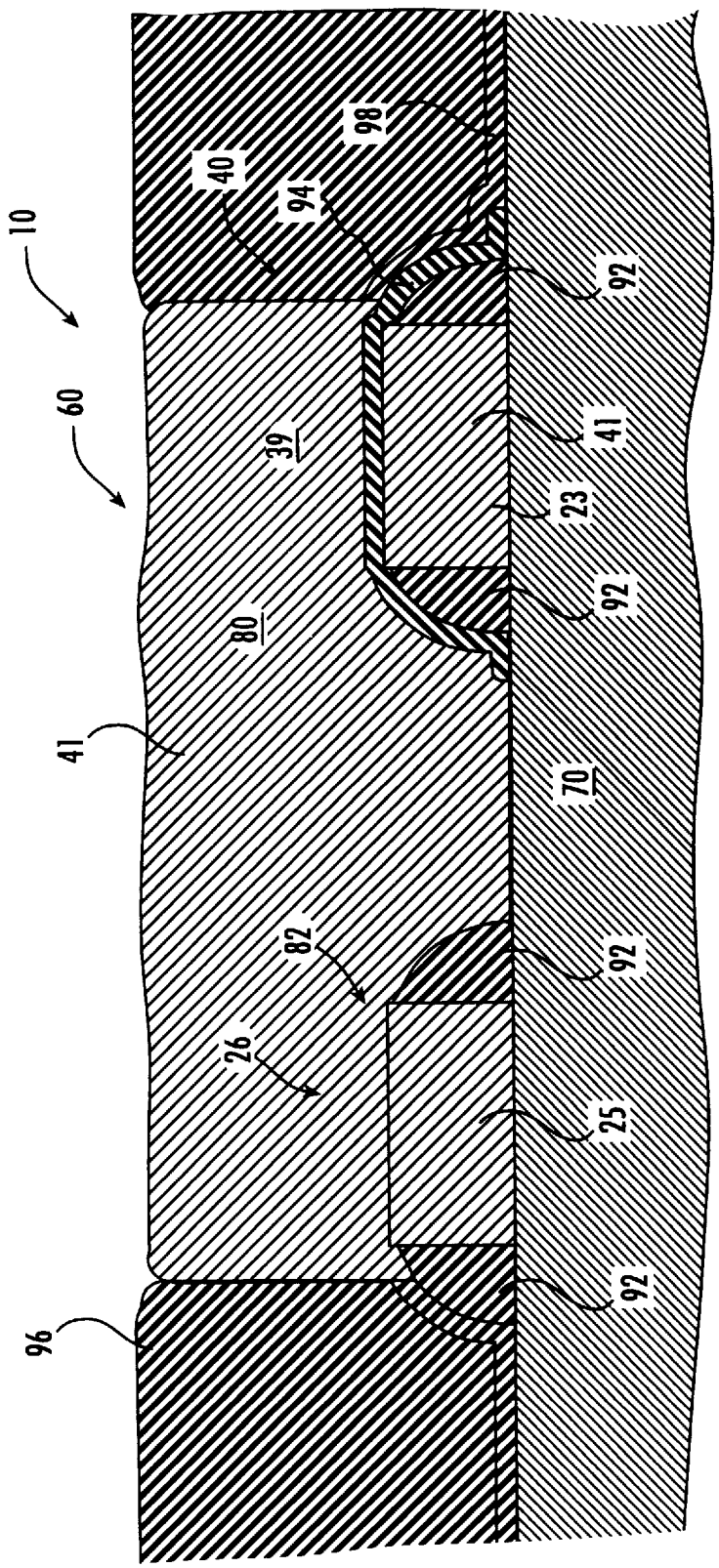
FIG. 3 is a cross-sectional view of a semiconductor substrate about line 3—3 of the memory cell schematically illustrated in FIG. 2.

With reference to FIGS. 2 and 3, cell 10 includes transistors 22 and 24 (FIG. 2) which are laterally formed in a semiconductor substrate 70 (FIG. 3). Transistor 22 includes drain 66, gate 54, and source 72. Transistor 24 includes drain 64, gate 56, and source 76. Drains 64 and 66 as well as sources 72 and 76 are highly doped N-type regions formed in a P-type substrate such as substrate 70 (FIG. 3) which is preferably coupled to ground.

With reference to FIG. 3, a cross section through 3:3' in FIG. 2 includes conductive line 23 and conductive line 25. Conductive lines 23 and 25 are preferably provided between insulative transistor spacers 92 on substrate 70. Transistors spacers 92 can be a lightly doped drain (LDD) spacer or silicide spacer such as $SiO_2$, SiON, SiN, or other spacer material. Conductive line 23 is covered by a dielectric material 94. Dielectric material 94 is covered by local interconnect 80. Local interconnect 80 is also provided over and electrically coupled to conductive line 25 at area 82. On each side of conductive lines 23 and 25, an insulating layer 96 is provided.

Cross-section 3:3' includes a capacitive structure (represented in FIGS. 1 and 2 by capacitor 40) formed by local interconnect 80, material 94 and conductive line 23. Capacitor 42 (not shown in FIG. 3–5) is similarly formed by interconnect 84, a material identical or similar to material 94, and conductive line 25. Thus, capacitor 42 is similar to capacitor 40 shown in FIG. 3, however, the dielectric layer 94 is provided on conductive line 25 and interconnect 84 is electrically coupled to conductive line 23.

Interconnects 80 and 84 are preferably from 5000 A to 8000 Angstroms (A) thick (depending upon the fabrication technique). Polysilicon lines 23 and 25 are preferably 1500 (or less) to 2000 A thick and 0.1 to 1.0 microns wide depending on the fabrication technology. Dielectric material 94 is preferably from 40 to 200 A thick. The capacitance associated with capacitors 40 and 42 can be increased by making material 94 thinner, local interconnects 80 and 84 wider, and polysilicon conductive lines 23 and 25 wider. However, interconnects 80 and 84 and lines 23 and 25 should be kept as small as possible to reduce the size of cell 10.

Dielectric material 94 preferably has high dielectric constant to maximize the capacitance of capacitors 40 and 42. Dielectric material 94 should preferably be a high-temperature oxide such as a TEOS-based oxide, or a two-layer stack with oxide over nitride to increase etch selectivity. An etch stop layer 98 is preferably from 200 to 800 A thick and is utilized in the fabrication steps for making cell 10 and capacitors 40 and 42 which are described below with reference to FIGS. 3–5. Layer 98 can be a nitride layer such as silicon nitride or other etch stop layer.

Insulating layer 96 is preferably an insulating layer between a metal one layer and polysilicon gate layer and can normally be silicon dioxide ($SiO_2$) deposited from TEOS carrier gas. Insulating layer 96 is preferably 4000 to 8000 A microns thick. Layer 96 can be spin-on-glass (SOG), silicon dioxide, or other dielectric substances. Conductive lines 23 and 25 can be replaced by other types of polysilicon, silicide, titanium, amorphous silicon, metals, tungsten or other conductors.

Figure 4:
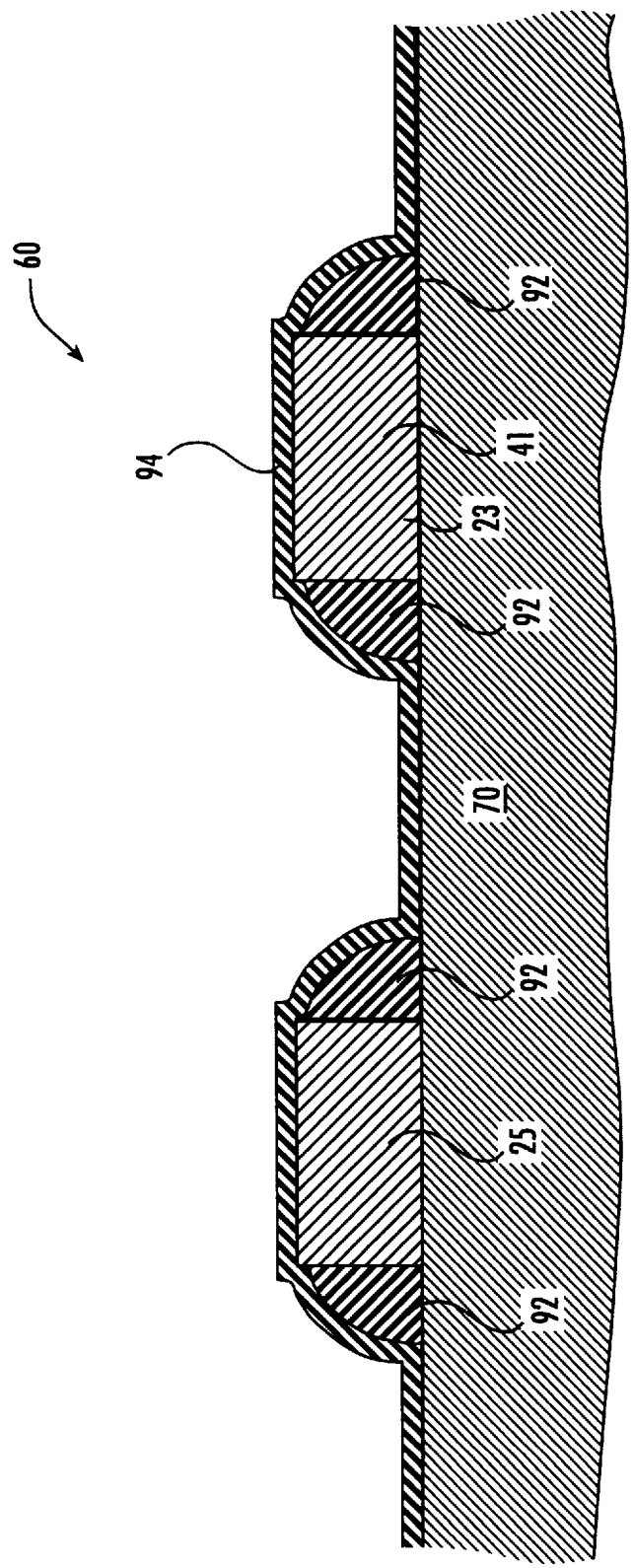
FIG. 4 is a cross-sectional view of the semiconductor substrate illustrated in FIG. 3 including a conformal dielectric layer.
Figure 5:
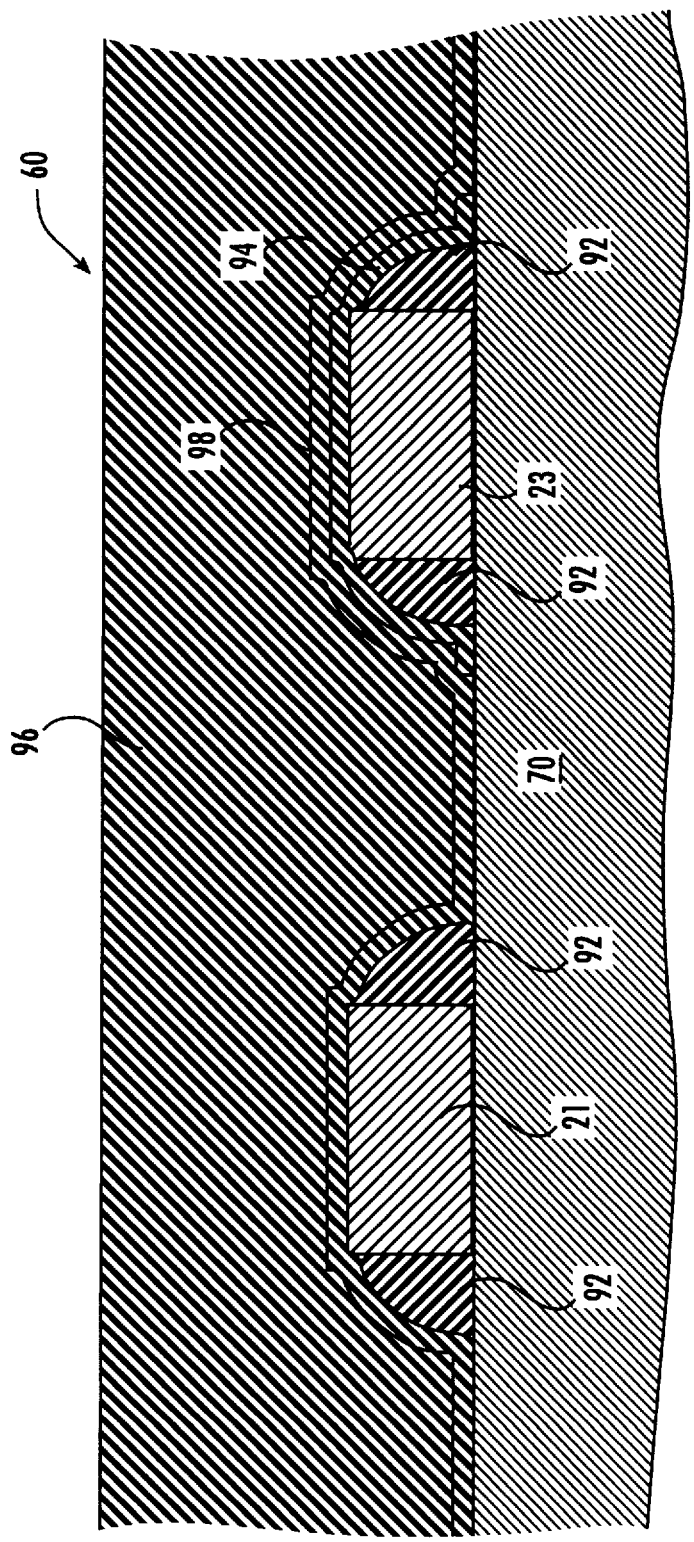
FIG. 5 is a cross-sectional view of the semiconductor substrate illustrated in FIG. 4 wherein the dielectric conformal layer is partially etched and covered by an etch stop layer and an insulating layer.

With reference to FIGS. 3, 4 and 5, the method of manufacturing cell 10 including capacitors 40 and 42 is described as follows. Cell 10 including capacitors 40 and 42 is advantageously manufactured according to fabrication steps associated with local interconnect formation and does not require significant additional steps. In FIG. 4, cross-section 3:3' is shown having polysilicon conductive lines 23 and 25 substantially formed between spacers 92 above substrate 70.

After lines 23 and 25 are deposited or otherwise formed, material 94 can be deposited or grown over lines 23 and 25.

Material 94 is preferably as thin as possible and can be an insulative or dielectric material such as silicon dioxide. After material 94 is grown or deposited, material 94 is selectively etched to form capacitors 40 and 42. To form capacitor 40, material 94 is etched over line 25 but not over line 23. Material 94 can be etched by plasma etching, wet etching or other removal process. Material 94 preferably has a resistance to an etch of layers 96 and 98.

With reference to FIG. 5, after selectively etching material 94, etch stop layer 98 is deposited over lines 23 and 25. Layer 98 has a preferred thickness of 600 A. Layer 98 is preferably silicon nitride and is deposited similar to material 94 by evaporating, collimated sputtering, physical vapor deposition, sputter deposition, or other deposition techniques. After layer 98 is deposited, layer 96 is deposited over lines 23 and 25. Etch stop layer 96 is resistent to the etch of layer 98. Lines 23 and 25 preferably are resistent to the etch of layer 96. Layer 96 can be deposited by any of the above-described methods.

With reference to FIG. 3, layer 96 is etched to expose material 98. Layer 98 is also etched to remove all of layer 98 from above lines 23 and 25. Etching can be by reactive ion etching (RIE), wet etching, or other removal techniques. Etching is preferably performed at an angle of 90 degrees. After etching, local interconnect 80 (FIG. 3) is deposited on line 25 and over layer 94, thereby forming capacitor 40.

Local interconnect 80 can be deposited by evaporating, collimated sputtering, physical vapor deposition, sputter deposition, or other deposition techniques. Interconnect 80 is similar to interconnect 84 discussed with reference to FIG. 2. After interconnect 80 is formed, interconnect 80 can be planarized or etched back and covered with a layer such as layer 96 (e.g., silicon dioxide, SOG, TEOS oxide, PECVD TEOS oxide, SiH$_4$ based PECVD oxide or a two layer glass and nitride material). Metal layers for various connections to interconnects 80 and 84 and other components of cell 10 are provided over the layer covering interconnects 80 and 84.

With reference to FIGS. 1–5, local interconnects 80 and 84 normally connect to conductive lines 23 and 25 wherever they cross. However, to form advantageous capacitors 40 and 42, a dielectric layer such as dielectric material 94 is provided between the local interconnect and the conductive line to selectively form capacitors 40 and 42. Cell 10 can be made according to conventional fabrication processes with modifications to provide the advantageous capacitive effects associated with capacitors 40 and 42. Interconnects 80 and 84 can be deposited as 8000 A thick layers and polished or etched to be thinner layer. Capacitors 40 and 42 are manufactured by a local interconnect coming from a cross coupled contact of each polysilicon gate or polysilicon conductive line and covering most of the other polysilicon conductive line. Where the local interconnects such as interconnects 80 and 84 are coincident with other conductive lines, capacitors are formed.

It is understood that, while the detailed drawings and specific examples given describe the exemplary embodiments of the present invention, they are for the purpose of illustration only. The apparatus and method of the invention is not limited to the precise details, geometries, materials, dimensions, and conditions disclosed. For example, although particular layers are described as being particular sizes, other sizes could be utilized. Further, although polysilicon is used as the conductive film, other conductive materials may be utilized especially as fabrication technologies make smaller sizes possible. Further, single lines and various drawings can represent multiple conductors. Various changes can be made to details disclosed without departing from the spirit of invention which is defined by the following claims.

What is claimed is:

1. A memory cell having enhanced cell capacitance, the memory cell comprising:
    a portion of a semiconductor substrate;
    a first inverter having a first inverter input and a first inverter output; and
    a second inverter having a second inverter input and a second inverter output, the second inverter input being coupled to the first inverter output by a first conductive line having a bottom side coplanar with a top surface of the portion of the semiconductor substrate, and the second inverter output being coupled to the first inverter input by a second conductive line having a bottom side coplanar with the top surface of the portion of the semiconductor substrate, wherein a first local interconnect is provided over the first conductive line and is electrically coupled to the second conductive line, wherein a first dielectric material is provided between the first conductive line and the first local interconnect, the first local interconnect substantially covering the first conduct line within the memory cell, whereby capacitance associated with the first inverter output is enhanced.

2. The memory cell of claim 1 wherein a second local interconnect is provided over the second conductive line and electrically coupled to the first conductive line, wherein a second dielectric material is provided between the second conductive line and the second local interconnect, whereby capacitance associated with the second inverter output is increased.

3. The memory cell of claim 2 wherein the first and second conductive lines comprise polysilicon.

4. The memory cell of claim 3 wherein the first and second local interconnects comprise tungsten.

5. The memory cell of claim 4 wherein the first and second conductors have a T-shape from a top planar view within the memory cell.

6. The memory cell of claim 5 wherein the first inverter includes a first load transistor having a first load gate and a first pull down transistor having a first pull gate, wherein the first load gate and the first pull gate are coupled together by the second conductive line.

7. The memory cell of claim 6 wherein the second inverter includes a second load transistor having a second load gate and a second pull down transistor having a second pull gate, wherein the second load gate and the second pull gate are coupled together by the first conductive line.

8. A SRAM memory cell comprising:
    a first transistor and a second transistor forming a storage unit, the first transistor having a first gate and a first drain, the second transistor having a second gate and a second drain, the first gate being coupled to the second drain by a first conductive line, the second gate being coupled to the first drain by a second conductive line, wherein the first conductive line is partially covered by a first dielectric layer and the first dielectric layer is covered by a first local interconnect, wherein the first local interconnect is electrically coupled to the second conductive line.

9. The memory cell of claim 8 wherein the second conductive line is partially covered by a second dielectric layer and the second dielectric layer is covered by a second local interconnect, wherein the second local interconnect is electrically coupled to the first local interconnect.

10. The memory cell of claim 9 wherein the first and second dielectric layers are a high temperature oxide.

11. The memory cell of claim 8 wherein the first local interconnect is tungsten.

12. The memory cell of claim 10 wherein the first and second dielectric layers are a TEOS-based oxide.

13. The memory cell of claim 9 wherein the first and second local interconnects are tungsten.

14. The memory cell of claim 13 wherein the first and second conductive lines are polysilicon.

15. The memory cell of claim 8 wherein the first and second conductive lines are polysilicon.

16. A method of manufacturing a capacitive structure for a memory cell including a first pull down transistor having a first gate and a first drain and a second pull down transistor having a second gate and a second drain, the method comprising:

providing a first conductive line from the first gate to the second drain;

providing a second conductive line from the second gate to the first drain;

providing a first dielectric layer over at least a portion of the first conductive line; and providing a first local interconnect electrically coupled to the second conductive line and over the first dielectric layer.

17. The method of claim 16 further comprising:

providing a second dielectric layer over at least a portion of the second conductive line; and providing a second local interconnect electrically coupled to the first conductive line and over the second dielectric layer.

18. The method of claim 17 wherein providing first and second conductive lines includes utilizing polysilicon and then providing the first and second local interconnects includes utilizing tungsten.

19. The method of claim 16 wherein the steps of providing the first dielectric layer includes selectively etching the first dielectric layer.

20. The method of claim 19 wherein the selectively etching step includes providing an etch stop layer over the portion of the first conductive line.

* * * * *